US009343118B2

(12) United States Patent
Son (10) Patent No.: US 9,343,118 B2
(45) Date of Patent: May 17, 2016

(54) VOLTAGE REGULATOR AND APPARATUS FOR CONTROLLING BIAS CURRENT

(71) Applicant: SK hynix Inc., Icheon-si Gyeonggi-do (KR)

(72) Inventor: Yeong Joon Son, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 148 days.

(21) Appl. No.: 14/255,142

(22) Filed: Apr. 17, 2014

(65) Prior Publication Data

US 2015/0124546 A1    May 7, 2015

(30) Foreign Application Priority Data

Nov. 1, 2013    (KR) .................. 10-2013-0132090

(51) Int. Cl.
 *G11C 5/14*    (2006.01)
(52) U.S. Cl.
 CPC ........................... *G11C 5/147* (2013.01)
(58) Field of Classification Search
 CPC ...................................... G11C 5/147
 USPC ........................................ 365/226
 See application file for complete search history.

(56) References Cited

U.S. PATENT DOCUMENTS

| 5,883,504 | A  | * | 3/1999  | Okada ................ G05F 3/22 323/276 |
| 7,411,376 | B2 | * | 8/2008  | Zhang ................ G11C 5/147 323/277 |
| 2002/0041178 | A1 | * | 4/2002  | Hiraki ................ G06F 1/26 323/272 |
| 2003/0011952 | A1 | * | 1/2003  | Fukui ................ G05F 1/573 361/93.1 |
| 2008/0265853 | A1 | * | 10/2008 | Chen ................ G05F 1/571 323/280 |
| 2010/0213909 | A1 | * | 8/2010  | Nakashimo .......... G05F 1/5735 323/282 |

FOREIGN PATENT DOCUMENTS

KR    100608112 B1    7/2006

* cited by examiner

*Primary Examiner* — Min Huang
(74) *Attorney, Agent, or Firm* — William & Park Associates Ltd.

(57) ABSTRACT

A voltage regulator includes: a comparator configured to compare a feedback voltage with a reference voltage to output an enable signal and operate based on a bias current; a pass transistor turned on according to the enable signal and configured to output an external power voltage as an output voltage; a voltage distribution circuit configured to distribute and output the output voltage to an input terminal of the comparator; and a bias current control unit configured to control an amount of the bias current supplied to the comparator based on the output voltage.

12 Claims, 8 Drawing Sheets

VOLTAGE REGULATOR AND APPARATUS FOR CONTROLLING BIAS CURRENT

CROSS-REFERENCE TO RELATED APPLICATION

The present application claims priority to Korean patent application number 10-2013-0132090 filed on Nov. 1, 2013, in the Korean Intellectual Property Office, the entire disclosure of which is incorporated by reference herein.

BACKGROUND

1. Technical Field

The present invention relates to a voltage regulator. More specifically, the present invention relate to a voltage regulator and an apparatus for controlling a bias current according to an output voltage.

2. Related Art

As mobile information devices, such as a smartphone, a tablet PC, etc., which use semiconductor memory devices as storage media, become more widely used, interest in and importance of semiconductor memory devices are significantly increasing. Thus, with the advent of various applications in addition to parallelization with high-speed processors or a multi-core, higher performance and reliability are required of semiconductor memory devices.

Semiconductor memory devices are storage devices implemented with semiconductors such as silicon (Si), germanium (Ge), gallium arsenide (GaAs), and indium phosphide (InP). Semiconductor memory devices are largely divided into volatile memory devices and nonvolatile memory devices. Volatile memory devices lose stored data when power supply is interrupted. Examples of volatile memory devices include a static RAM (SRAM), a dynamic RAM (DRAM), and a synchronous DRAM (SDRAM). Non-volatile memory devices maintain stored data even when power supply is interrupted. Examples of non-volatile memory devices include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), and so on. Flash memories are generally divided into a NOR type and a NAND type.

Semiconductor memory devices include several functional blocks. A constant voltage generation device may be used to supply power to each functional block. A voltage regulator is configured to convert an external power voltage into a stable power voltage to stably supply the power voltage to the several functional blocks, that is, driving circuits.

SUMMARY

An embodiment of the present invention provides a voltage regulator including: a comparator configured to compare a feedback voltage with a reference voltage to output an enable signal and operate based on a bias current; a pass transistor turned on according to the enable signal and configured to output an external power voltage as an output voltage; a voltage distribution circuit configured to distribute and output the output voltage to an input terminal of the comparator; and a bias current control unit configured to control an amount of the bias current supplied to the comparator based on the output voltage.

An embodiment of the present invention provides a bias current control device including: a voltage sensing block coupled to an output terminal of a voltage regulator and configured to generate a current control signal in response to a voltage change of the output terminal; and a current control unit coupled to a bias current input terminal of the voltage regulator and configured to control a current flowing into the bias current input terminal in response to the current control signal sensing block.

In an embodiment of the present invention, a memory system comprises: a controller coupled to a semiconductor memory device, wherein the semiconductor memory device includes: a comparator configured to compare a feedback voltage with a reference voltage to output an enable signal and operate based on a bias current; a pass transistor turned on according to the enable signal and configured to output an external power voltage as an output voltage; a voltage distribution circuit configured to distribute and output the output voltage to an input terminal of the comparator; and a bias current control unit configured to control an amount of the bias current supplied to the comparator based on the output voltage.

BRIEF DESCRIPTION OF THE DRAWINGS

The above and other features and advantages of the present invention will become more apparent to those of ordinary skill in the art by describing in detail various embodiments thereof with reference to the attached drawings in which.

DETAILED DESCRIPTION

Advantages and features of the present invention, and implementation methods thereof will be clarified through following embodiments described with reference to the accompanying drawings. The present invention may, however, be embodied in different forms and should not be construed as limited to the embodiments set forth herein. Hereinafter, preferred embodiments of the present invention will be described in detail such that a person skilled in the art may carry out the technical idea of the present invention easily.

In this disclosure below, when one part is referred to as being "connected" to another part, it should be understood that the former can be "directly connected" to the latter, or "indirectly connected" to the latter via an intervening part. Furthermore, when one part is referred to as "comprising (or including or having)" other elements, it should be understood that it can comprise (or include or have) only those elements, or other elements as well as those elements if there is no specific limitation.

Figure 1:
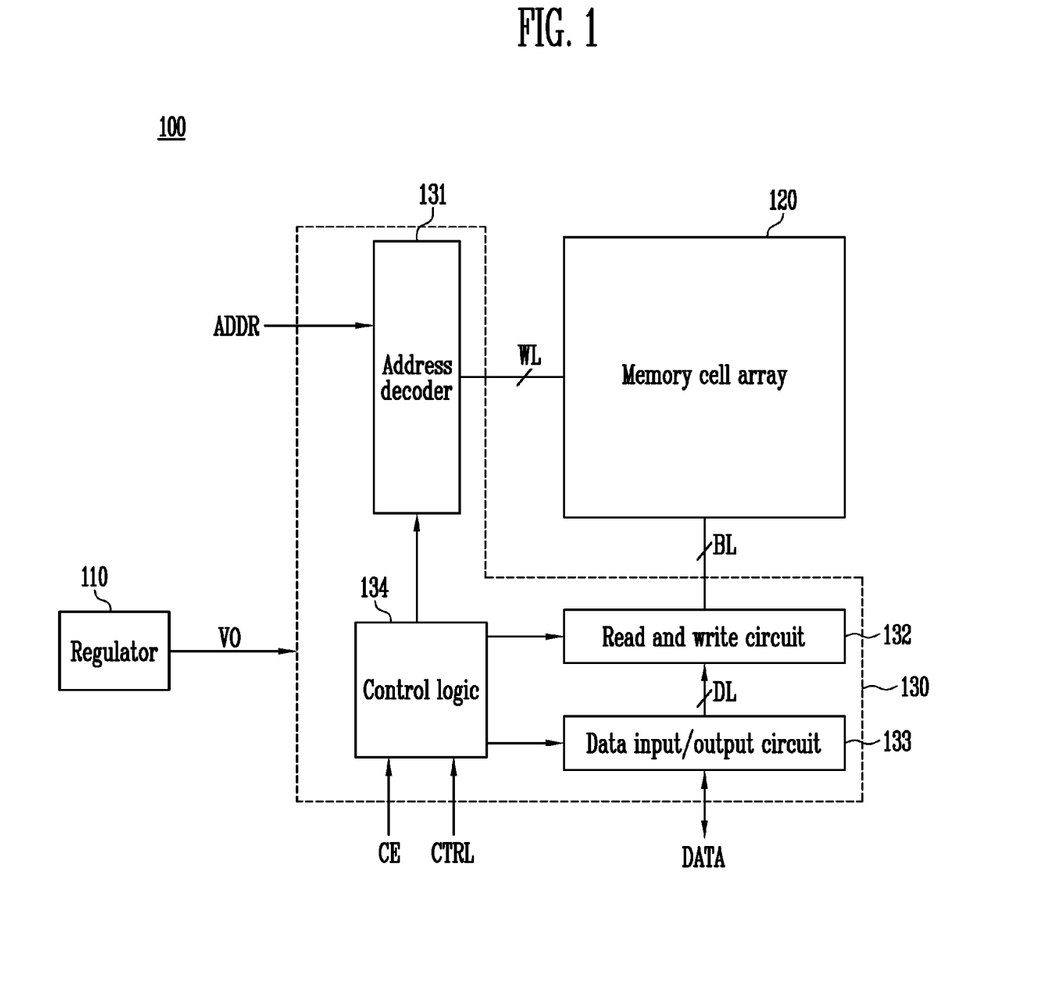
FIG. 1 is a block diagram showing a semiconductor memory device and a voltage regulator that provides a power voltage to the semiconductor memory device.

FIG. 1 is a block diagram showing a semiconductor memory device and a voltage regulator that provides a power voltage to the semiconductor memory device.

Referring to FIG. 1, a semiconductor memory device 100 includes a memory cell array 120, a peripheral circuit 130, and a voltage regulator 110.

The memory cell array 120 is electrically coupled to an address decoder 131 through word lines WL and electrically coupled to a read and write circuit 132 through bit lines BL. The memory cell array 120 includes a plurality of memory blocks (not shown). The plurality of memory blocks include a plurality of memory cells. For example, the memory cells, which are disposed in a row direction, are electrically coupled to the word lines WL. The memory cells, which are disposed in a column direction, are electrically coupled to the bit lines BL. Each of the plurality of memory cells may operate as a single level cell (SLC) or a multi-level cell (MLC). As an example, the plurality of memory cells may be non-volatile memory cells.

The address decoder 131 is electrically coupled to the memory cell array 120 through the word lines WL. The address decoder 131 may be configured to operate according to an output signals of a control logic 134. The address decoder 131 may receive addresses ADDR from the external device (not shown).

The address decoder 131 is configured to decode a block address among the addresses ADDR. The address decoder 131 selects one memory block from among the plurality of memory blocks of the memory cell array 120 according to the decoded block address.

The address decoder 131 is configured to decode a row address among the addresses ADDR. The address decoder 131 selects one word line from among the word lines electrically coupled to the memory block selected according to the decoded row address.

The address decoder 131 may include a block decoder, an address decoder, and an address buffer.

The read and write circuit 132 is electrically coupled to the memory cell array through the bit lines BL and electrically coupled to a data input/output circuit 133 through data input/output lines DL. The read and write circuit 132 also operates in response to control of the control logic 134.

In a programming operation, the read and write circuit 132 receives program data DATA from the data input/output circuit 133 through the data input/output line DL and delivers the program data DATA to the bit lines BL. The delivered data is programmed in the memory cells that are electrically coupled to the selected word lines.

In a read operation, the read and write circuit 222 reads the data from the memory cells electrically coupled to the selected word line through the bit lines BL and outputs the read data DATA to the data input/output circuit 133 through the data input/output lines DL.

In an erase operation, the read and write circuit 132 enables the bit lines BL to be floated.

As an example, the read and write circuit 132 may include page buffers, a column selection circuit, etc.

The data input/output circuit 133 is electrically coupled with the read and write circuit 132 through the data input/output lines DL. The data input/output circuit 133 operates in response to control of the control logic 134.

The data input/output circuit 133 communicates data DATA with the external device. In a programming operation, the data input/output circuit 133 receives the program data DATA from the external device and delivers the program data DATA to the read and write circuit 132. In a read operation, the data input/output circuit 133 receives the data DATA from the read and write circuit 132 and outputs the data DATA to the external device.

The control logic 134 receives a control signal CTRL from the outside. The control logic 134 is configured to control overall operation of the semiconductor memory device 100 in response to the control signal CTRL.

The control logic 134 further receives a chip enable signal CE. The chip enable signal CE is a signal received from the external device for selecting the semiconductor memory device 100.

The control logic 134 determines an operation mode of the semiconductor memory device 100 on the basis of the chip enable signal CE. When the chip enable signal CE is enabled, the semiconductor memory device 100 may operate in an activation mode. That is, when the chip enable signal CE is enabled, the semiconductor memory device 100 may perform the programming operation, the read operation, or the erase operation.

When the chip enable signal CE is disabled, the semiconductor memory device 100 may operate in a standby mode.

The voltage regulator 110 may supply a certain voltage to each element 131, 132, 133 and 134 of the peripheral circuit 130. Though the voltage regulator 110 may be described as a circuit for supplying an output voltage VO to the peripheral circuit 130 in FIG. 1, the voltage regulator 110 may supply necessary various voltages to the address decoder 131, the read and write circuit 132, the data input/output circuit 133, and the control logic 134 in the peripheral circuit 130.

During the operation of the semiconductor memory device 100, the output voltage VO may be temporarily changed due to an operation of an element electrically coupled to an output terminal of the voltage regulator 110. For example, when a current flowing out of the output terminal of the voltage regulator 110 is temporarily increased, a voltage of the output terminal of the voltage regulator 110 may be temporarily decreased. The typical voltage regulator 110 senses a voltage drop of the output terminal and turns on a pass transistor, which receives the external voltage, thereby recovering the output voltage VO. For the purpose of a stable operation of the semiconductor memory device 100, the output voltage VO needs to be recovered quickly when the output voltage VO is dropped in the output terminal of the voltage regulator 110.

Figure 2:
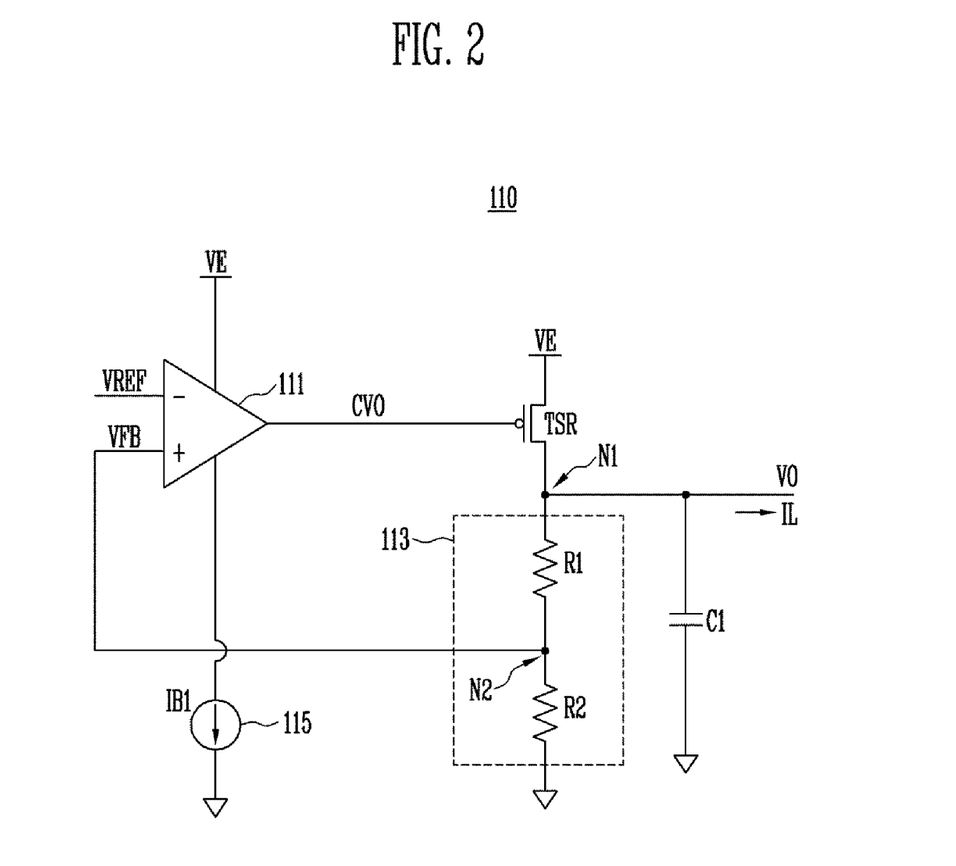
FIG. 2 is a view illustrating operations of a voltage regulator according to a change in an output current.

FIG. 2 is a view illustrating operations of the voltage regulator according to a change in an output current.

Referring to FIG. 2, the voltage regulator 110 includes a comparator 111, a pass transistor TSR, and a voltage distribution circuit 113. The comparator 111 compares a feedback voltage VFB with a reference voltage VREF to output an enable signal CVO, and operates on the basis of a first bias current IB1 that is supplied by a first bias current source 115.

That is, the comparator 111 is provided with the first bias current IB1 by the first bias current source 115 and provided with a bias voltage from an external power voltage VE. The comparator 111 receives the reference voltage VREF and the feedback voltage VFB at its input terminal. The output terminal of the comparator 111 is electrically coupled to a gate of the pass transistor TSR. That is, the comparator 111 provides the enable signal CVO to the pass transistor TSR.

The pass transistor TSR is turned on by the enable signal CVO to output the external power voltage VE at the output terminal N1 as the output voltage VO. For example, the pass transistor TSR may be a PMOS transistor. A source of the pass transistor TSR is electrically coupled to the external power voltage VE, and a drain thereof is electrically coupled to the output terminal N1.

The voltage distribution circuit 113 is electrically coupled between the output terminal N1 and the ground, and composed of a first resistor R1 and a second resistor R2, which are connected in series. The voltage distribution circuit 113 distributes and outputs the output voltage VO to an input terminal of the comparator 111 as a feedback voltage VFB. Specifically, the voltage distribution circuit 113 distributes the output voltage VO through the distribution node N2 where the first resistor R1 and the second resistor R2 are electrically coupled, to provide the output voltage VO to the input terminal of the comparator 111 as the feedback voltage VFB.

A load capacitor C1 may be electrically coupled to the output terminal of the voltage regulator 110, and a load current IL may flow in the output terminal. When the output voltage VO is changed, the feedback voltage generated through the voltage distribution circuit 113 is changed proportionally with the output voltage VO. The comparator 111 may compare the feedback voltage VFB with the reference voltage VREF to generate the enable signal CVO. According to the generated enable signal CVO, the pass transistor TSR may be selectively turned on to control the output voltage VO of the output terminal N1.

For example, when the output voltage VO drops due to a temporary increase in the load current IL, the feedback voltage VFB also drops. Thus, the comparator 111 may compare the feedback voltage VFR with the reference voltage VREF to generate the corresponding enable signal CVO. When the feedback voltage VFB is lower than the reference voltage VREF, the enable signal CVO may have a logic low value. In this case, since the enable signal CVO, which is received at the gate of the pass transistor TSR including a PMOS transistor, is a logic low value, the pass transistor TSR is turned on to allow a current to flow between the source and the drain of the pass transistor TSR. Accordingly, the voltage of the output terminal N1, that is, the output voltage VO may be increased and recovered.

In order to quickly recover the voltage of the output terminal N1 of the voltage regulator 110, the load capacitance C1 is required to be small. However, the load capacitance C1 cannot be arbitrarily controlled. Alternately, when the output voltage VO drops temporarily, the output voltage VO may be quickly recovered by quickly turning on the pass transistor TSR of the voltage regulator 110. In order to quickly turn on the pass transistor TSR, it is required to tune operation characteristics of the pass transistor TSR or to quickly change the enable signal CVO input through the pass transistor TSR to a logic low value. In order to quickly change the enable signal CVO, operation characteristics of the comparator 111 need to be improved. The voltage regulator 110 is configured to increase a bias current input to the comparator 111 when the output voltage VO is dropped, thereby enhancing the operation speed of the comparator 111 and quickly recovering the output voltage.

Figure 3:
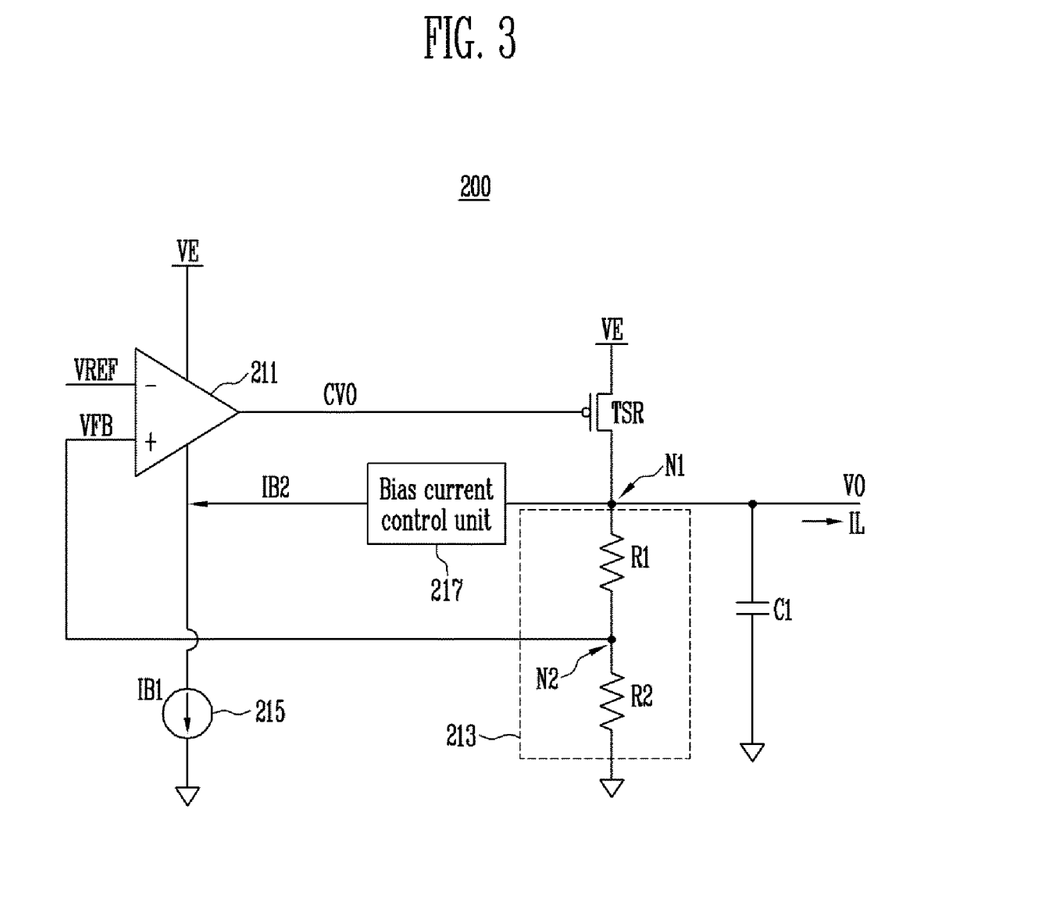
FIG. 3 is a block diagram showing a voltage regulator according to an embodiment of the present invention.

FIG. 3 is a block diagram showing a voltage regulator according to an embodiment of the present invention. In the configuration of FIG. 3, repetitive description of the same elements as those of the configuration of FIG. 2 will be omitted.

Referring to FIG. 3, the voltage regulator 200 includes a comparator 211, a pass transistor TSR, a voltage distribution circuit 213, and a bias current control unit 217. The comparator 211 compares a feedback voltage VFB with a reference voltage to output an enable signal CVO, and operates on the basis of a first bias current IB1 and a second bias current IB2 that are supplied by a first bias current source 215 and a bias current control unit 217, respectively.

That is, the comparator 211 is provided with the first bias current IB1 and the second bias current IB2 by the first bias current source 215 and the bias current control unit 217 and provided with a bias voltage from an external power voltage VE. The comparator 211 receives the reference voltage VREF and the feedback voltage VFB through the input terminal. The output terminal of the comparator 211 is electrically coupled to a gate of the pass transistor TSR. The comparator 111 provides the enable signal CVO to the pass transistor TSR.

The pass transistor TSR is turned on by the enable signal CVO to output the external power voltage VE at the output terminal N1 as the output voltage VO. As an example, the pass transistor TSR may be a PMOS transistor. A source of the pass transistor TSR is electrically coupled to the external power voltage VE, and a drain thereof is electrically coupled to the output terminal N1.

The voltage distribution circuit 213 is electrically coupled between the output terminal N1 and the ground, and composed of a first resistor R1 and a second resistor R2, which are connected in series. The voltage distribution circuit 213 distributes and outputs the output voltage VO to an input terminal of the comparator 211 as a feedback voltage VFB.

The bias current control unit 217 is configured to control an amount of the second bias current IB2 supplied to the comparator 211 on the basis of the output voltage VO. Specifically, the bias current control unit 217 is configured to sense a drop of the output voltage VO when the output voltage VO is dropped temporarily, to increase the amount of the second bias current IB2. Accordingly, the bias current of the comparator 211, which is composed of the first and second bias currents IB1 and IB2, increases and thus the operation speed of the comparator 211 is allowed to increase. Thus, the enable signal CVO output by the comparator 211 is more quickly changed to a low logic value, and the pass transistor TSR is turned on, thereby more quickly recovering the output voltage VO. The bias current control unit 217 may be one of bias current control devices, which may be electrically coupled with a typical voltage regulator. A load capacitor C1 may be electrically coupled to the output terminal of the voltage regulator 110 and a load current IL may flow in the output terminal (FIG. 3 also illustrates a load current IL and load capacitance C1.) The bias current control unit 217 will be described in more detail below with reference to FIGS. 4 to 6.

Figure 4:
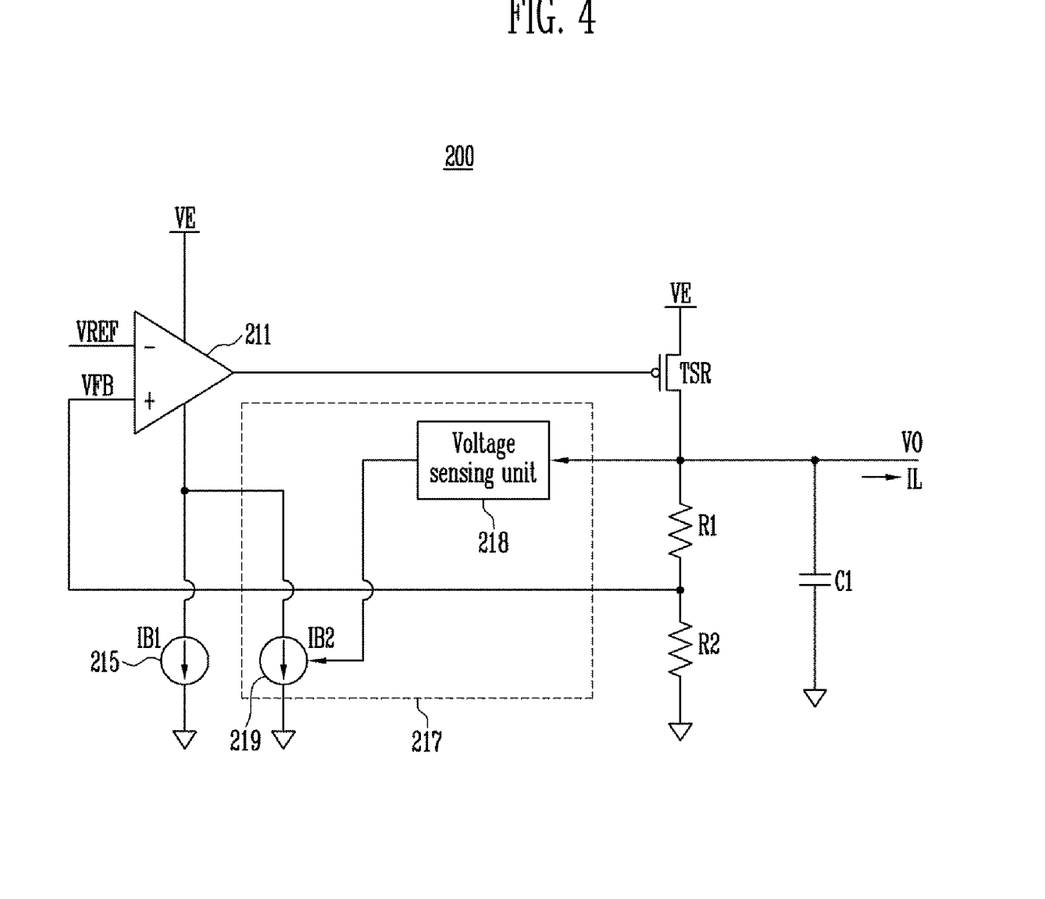
FIG. 4 is a block diagram showing a voltage regulator according to an embodiment of the present invention in further detail.

FIG. 4 is a block diagram showing the voltage regulator according to an embodiment of the present invention in further detail.

Referring to FIG. 4, the voltage regulator 200 includes a comparator 211, a pass transistor TSR, a voltage distribution circuit 213, and a bias current control unit 217. The comparator 211 is provided with a bias voltage from an external power voltage VE and supplied with the first bias current IB1 and the second bias current IB2 by the first bias current source 215 and the bias current control unit 217. In the configuration of FIG. 4, repetitive description of the same elements as those of the configurations of FIGS. 2 and 3 will be omitted.

The bias current control unit 217 of the voltage regulator 200 according to an embodiment of the present invention includes a voltage sensing unit 218 and a current control unit 219. The bias current control unit 217 senses a change in the output voltage VO to generate a current control signal. The current control signal is provided to the current control unit 219. The current control unit 219 controls an amount of the second bias current IB2 supplied to the comparator 211 on the basis of the current control signal.

As an example, the voltage sensing unit 218 may include any circuit that generates a signal changing in response to the output voltage VO. For example, the voltage sensing unit 218 may include a simple buffer circuit. The invention is not limited to the details of the voltage sensing unit 218. Thus, it may be appreciated that the voltage sensing unit 218 is referred to as any device that senses the output voltage VO to generate a corresponding signal.

As an example, the current control unit 219 may include any circuit that changes an amount of current according to a change in an input signal. For example, the current control unit 219 may include a dependent current source, or may include a current controlled current source (CCCS) or a voltage controlled current source (VCCS) according to an example. The invention is not limited to the details of the current control unit 219. Thus, it may be appreciated that the current control unit 219 is referred to as any device that changes an amount of the bias current input to the comparator 211 according to a change of the input signal.

Figure 5:
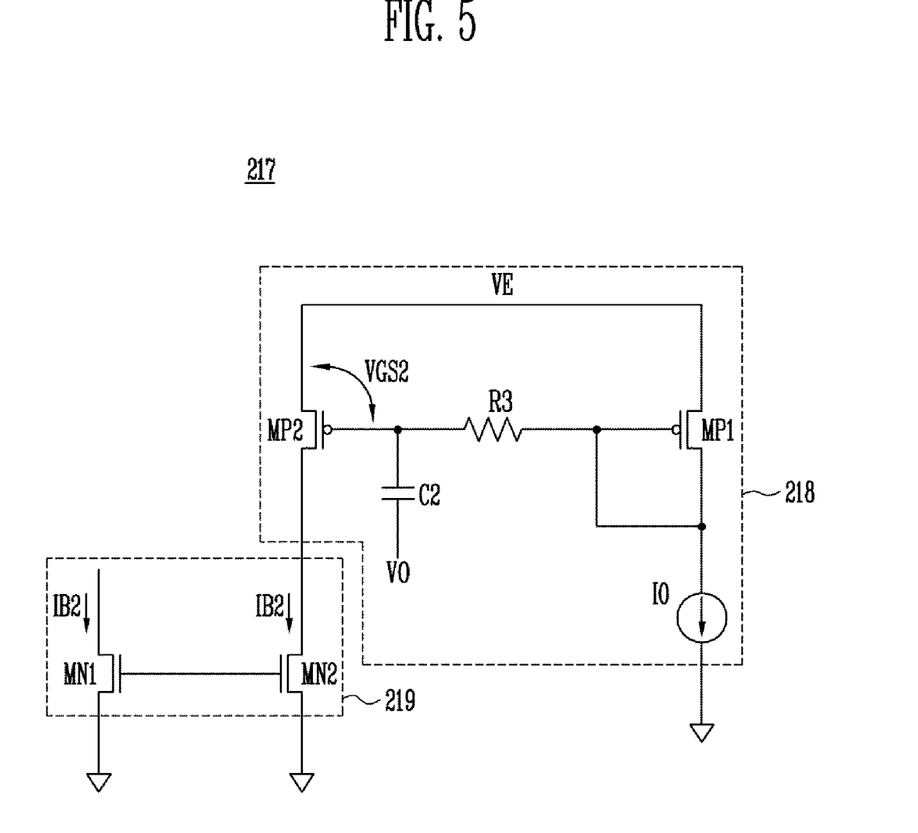
FIG. 5 is a circuit diagram showing a bias current control unit according to an embodiment of the present invention in further detail.

FIG. 5 is a circuit diagram showing a bias current control unit according to an embodiment of the present invention in further detail.

Referring to FIG. 5, the bias current control unit 217 includes a voltage sensing unit 218 and a current control unit 219. The voltage sensing unit 218 includes an internal current source 10, a first PMOS transistor MP1, a second PMOS transistor MP2, a third resistor R3, and a capacitor C2. A drain of the first PMOS transistor MP1 is electrically coupled to the internal current source 10, and a source thereof is electrically coupled to the external power voltage VE. In addition, a gate of the first PMOS transistor MP1 is electrically coupled to the drain thereof. One end of the third resistor R3 is electrically coupled to the gate of the first PMOS transistor MP1, and the other end is electrically coupled to a capacitor C2 and a gate of the second PMOS transistor MP2. The other end of the capacitor C2 is electrically coupled to the output terminal to receive the output voltage VO. The gate of the second PMOS transistor MP2 is electrically coupled to the capacitor C2 and the resistor R3, the source is electrically coupled to the external power voltage VE, and the drain is electrically coupled to the current control unit 219.

When the output voltage VO drops, a gate-source voltage VGS2 of the second PMOS transistor MP2 drops according to voltage characteristics of the capacitor C2. Accordingly, the second PMOS transistor MP2 is turned on to increase a source-drain current. A drain current of the second PMOS transistor MP2 is applied as a current control signal to the current control unit 219.

Accordingly, the voltage sensing unit 218 may be electrically coupled to an output terminal of the voltage regulator 200 and configured to generate a current control signal in response to a voltage change of the output terminal of the voltage regulator 200; and control a current that is output in response to change in the output voltage VO. A drain current of the second PMOS transistor MP2 of the voltage sensing unit 218 may be applied as a current control signal to the current control unit 219.

The current control unit 219 may include a mirror circuit that is electrically coupled to the drain of the second PMOS transistor MP2 of the voltage sensing unit 218 that may increase the bias current of the voltage regulator 200 based on an increase in the drain current of the second PMOS MP2 transistor. As an example, the current control unit 219 may include a first NMOS transistor MN1 and a second NMOS transistor MN2. A drain of the first NMOS transistor MN1 is electrically coupled to the drain of the second NMOS transistor MN2 of the voltage sensing unit 218, a source thereof is electrically coupled to the ground, and a gate thereof is coupled to the gate of the second NMOS transistor MN2. In addition, the gate and the drain of the first NMOS transistor MN1 are electrically coupled in common. The second NMOS transistor MN2 may have a gate coupled to the gate of the second PMOS transistor MP2, a source coupled to the ground, and a drain coupled to the comparator 211. Since the current control unit 219 shown in FIG. 5 includes a mirror circuit, a drain-source current flowing to the second NMOS transistor MN2 is a second bias current IB2 and has the same level as the drain-source current flowing to the first NMOS transistor MN1.

A drain of the second NMOS transistor MN2 of the current control unit 219 is electrically coupled to a bias input terminal of the comparator 211. Accordingly, the bias current of the comparator 211 is achieved by summing the first bias current IB1 flowing to the first bias current source 215 and the second bias current IB2. As a result, since the bias current of the comparator 211 is controlled by the bias current control unit 217 and the bias current input to the comparator 211 increases in response to a drop of the output voltage VO, the operation speed of the comparator 211 increases and thus the output voltage VO may be quickly recovered. That is, the voltage regulator 200 according to an embodiment of the present invention may quickly recover the output voltage VO when the output voltage VO drops, thereby enhancing stability of the semiconductor memory device. The current control unit 219 may also be configured to control a current flowing into the bias input terminal in response to the current control signal output from the voltage sensing unit 218.

Figure 6:
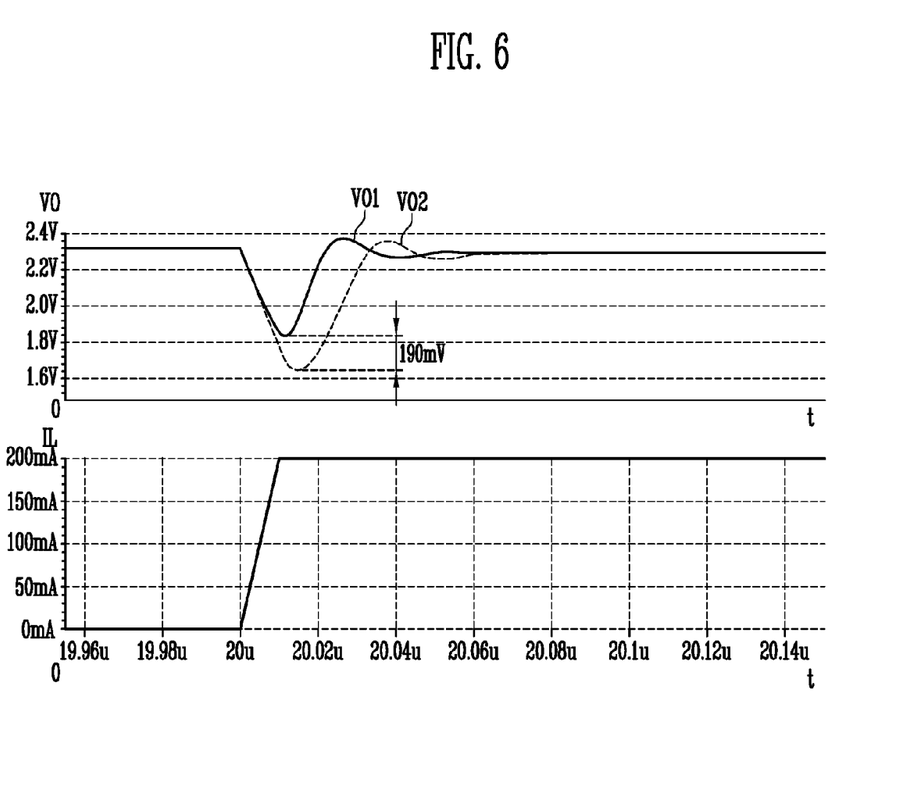
FIG. 6 is a timing chart illustrating an operation characteristic of a voltage regulator according to an embodiment of the present invention.

FIG. 6 is a timing chart illustrating an operation characteristic of the voltage regulator according to an embodiment of the present invention.

Referring to FIG. 6, a lower timing diagram shows a change in a load current IL over time t at the output terminal, and an upper timing diagram in the upper portion shows a change in the output voltage VO over time in response to the change in the load current IL.

First, referring to the lower timing diagram, an axis indicating time t is shown in a horizontal direction, and an axis indicating an amount of load current IL is shown in a vertical direction. The unit of time t is microseconds (μs), and the unit of current is milliamperes (mA). The range of time is 19.96 μs to 20.14 μs, and the range of the amount of the current is 0 mA to 200 mA. The timing diagram shown in FIG. 6 shows a case in which the amount of the load current IL increases from 0 mA to 200 mA in the range 20 μs≤t≤20.02 μs. Accordingly, as the load current IL increases at the output terminal N1, it can be seen that the output signal VO will drop temporarily.

Referring to the upper timing diagram, an axis indicating time t is shown in a horizontal direction, and an axis indicating an output voltage VO is shown in a vertical direction. In the upper timing diagram of FIG. 6, the output voltage VO1 of the voltage regulator 200 including the bias current control unit according to an embodiment of the present invention and the output voltage VO2 of the typical voltage regulator 110 are shown together.

Referring to the upper timing diagram in addition to the lower timing diagram, the output voltages VO1 and VO2 drop with the increase in the load current IL. That is, the output voltages VO1 and VO2 drop from about 2.3 V, which is a normal state before the voltage drop, to below 2.0 V when the load current IL increases. The change in the output voltage VO1 of the voltage regulator 200 including the bias current control unit according to an embodiment of the present invention is different from the change in the output voltage VO2 of the typical voltage regulator 110. Referring to FIG. 6, it can be seen that the output voltage VO1 of the voltage regulator 200 including the bias current control unit according to an embodiment of the present invention is recovered to the normal state, that is, about 2.3 V, more quickly than the output voltage VO2 of the typical voltage regulator 110. In addition, for a minimum voltage value, which is a voltage at a timing when the output voltage drops and begins to rise, the output voltage VO1 of the voltage regulator 200 including the bias current control unit according to an embodiment of the present invention is 190 mV higher than the output voltage VO2 of the typical voltage regulator 110. That is, the voltage regulator 200 including a bias current control unit according to an embodiment of the present invention has less drop in the output voltage when the load current IL increases, thereby improving stability of the semiconductor memory device.

Figure 7:
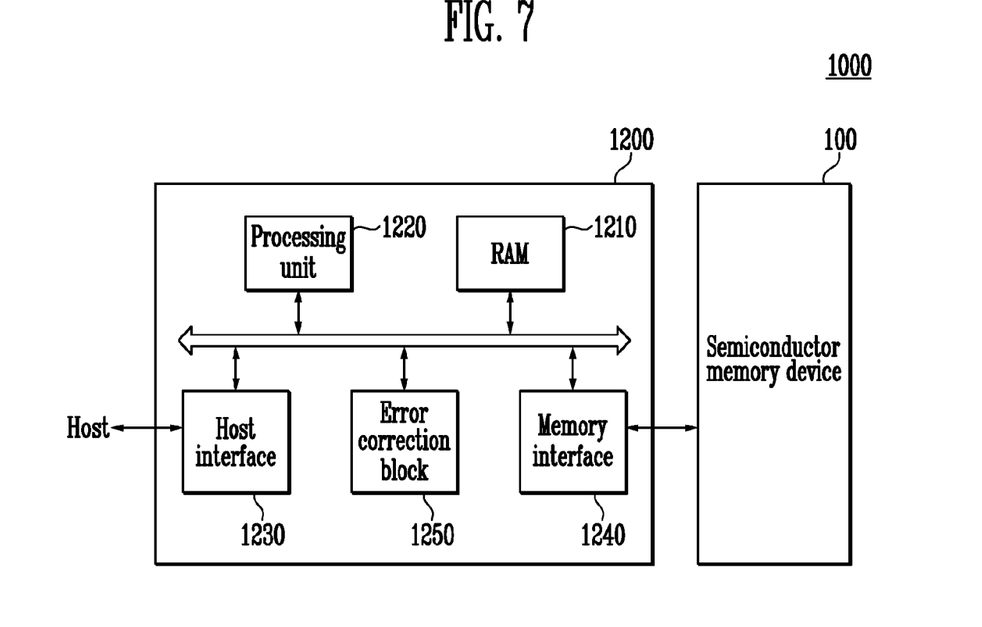
FIG. 7 is a block diagram showing a memory system including the semiconductor memory device of FIG. 1.

FIG. 7 is a block diagram showing a memory system 1000 including the semiconductor memory device 100 of FIG. 1.

Referring to FIG. 7, the memory system 1000 includes the semiconductor memory device 100 and a controller 1200.

The semiconductor memory device 100 may be configured to operate as described with reference to FIGS. 1 to 6. Accordingly, repetitive description will be omitted.

The controller 1200 is electrically coupled with a host and the semiconductor memory device 100. In response to a request from the host, the controller 1200 is configured to access the semiconductor memory device 100. For example, the controller 1200 is configured to control read, write, erase, and background operations of the semiconductor memory device 100. The controller 1200 is configured to provide an interface between the semiconductor memory device 100 and the host. The controller 1200 is configured to drive firmware for controlling the semiconductor memory device 100.

The controller 1200 includes a random access memory (RAM) 1210, a processing unit 1220, a host interface 1230, a memory interface 1240, and an error correction block 1250. The RAM 1210 may be used as at least one of a working memory of the processing unit 1220, a cache memory between the semiconductor memory device 100 and the host, and a buffer memory between the semiconductor memory device 100 and the host. The processing unit may control overall operations of the controller 1200.

The host interface 1230 includes a protocol for data exchange between the host and the controller 1200. As an example, the controller 1200 is configured to communicate with the host via at least one of various interface protocols such as a Universal Serial Bus (USB) protocol, a MultiMediaCard (MMC) protocol, a Peripheral Component Interconnect (PCI) protocol, PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol.

The memory interface 1240 is configured to interface with the semiconductor memory device 100. For example, the memory interface includes a NAND interface or NOR interface.

The error correction block 1250 is configured to detect and correct an error of data read from the semiconductor memory device 100, using an error correction code (ECC).

The controller 1200 and the semiconductor memory device 100 may be integrated as one semiconductor device. The controller 1200 and the semiconductor memory device 100 may be integrated as one semiconductor device to constitute a memory card. For example, the controller 1200 and the semiconductor memory device 1100 may be integrated as one semiconductor device to constitute a memory card such as a PC card (Personal Computer Memory Card International Association (PCMCIA)), a CompactFlash card (CF), a SmartMedia card (SM, SMC), a Memory Stick, an MMC (RS-MMC, MMCmicro), an SD card (SD, miniSD, microSD, SDHC), a Universal Flash Storage device (UFS) and the like.

The controller 1200 and the semiconductor memory device 100 may be integrated as one semiconductor memory device to constitute a semiconductor drive (solid state drive (SSD)). The semiconductor drive (SSD) includes a storage device configured to store data in the semiconductor memory. When the memory system 1000 is used as a semiconductor drive (SSD), an operation speed of the host coupled to the memory system 1000 is dramatically improved.

As another example, memory system 1000 is provided as one of various components of an electronic apparatus such as a computer, an ultra-mobile PC (UMPC), a workstation, a net-book, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, an apparatus capable of transmitting and receiving information in a wireless environment, one of various electronic apparatuses constituting a home network, one of various electronic apparatuses constituting a computer network, one of various electronic apparatuses constituting a telematics network, a radio frequency identification (RFID) device, and one of various components forming a computing system.

Specifically, the semiconductor memory device 100 or memory system 1000 may be mounted in various types of packages. For example, nonvolatile memory device 1100 or memory system 1000 may be mounted in a package such as package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a thin quad flat pack (TQFP), a system in package (SIP), a multi chip package (MCP), a wafer-level fabricated package (WFP), or a wafer-level processed stack package (WSP).

Figure 8:
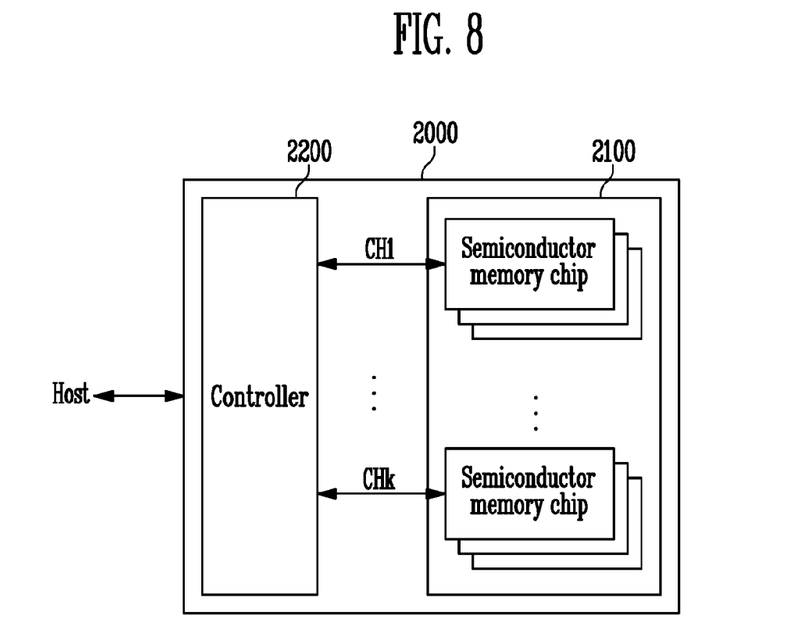
FIG. 8 is a block diagram showing an application example of the memory system of FIG. 7.

FIG. 8 is a block diagram showing an application example 2000 of the memory system 1000 of FIG. 7.

Referring to FIG. 8, the memory system 2000 includes a semiconductor memory device 2100 and a controller 2200. The semiconductor memory device 2100 includes a plurality of semiconductor memory chips. The plurality of memory chips are classified into a plurality of groups.

In FIG. 8, the plurality of groups are shown as communicating with the controller 2200 over first to kth channels CH1 to CHk. Each semiconductor memory chip may be configured to be identical to the semiconductor memory device 100 described with reference to FIG. 1 to operate identically.

Each group is configured to communicate with the controller 2200 over one common channel. The controller is configured to be identical to the controller 1200 described with reference to FIG. 7 and configured to control the plurality of memory chips of the semiconductor memory device 2100 via the plurality of channels CH1 to CHk.

In FIG. 8, the plurality of semiconductor memory chips are described as being connected to one channel. However, it will be appreciated that the memory system may be modified such that one semiconductor memory chip is connected to one channel.

Figure 9:
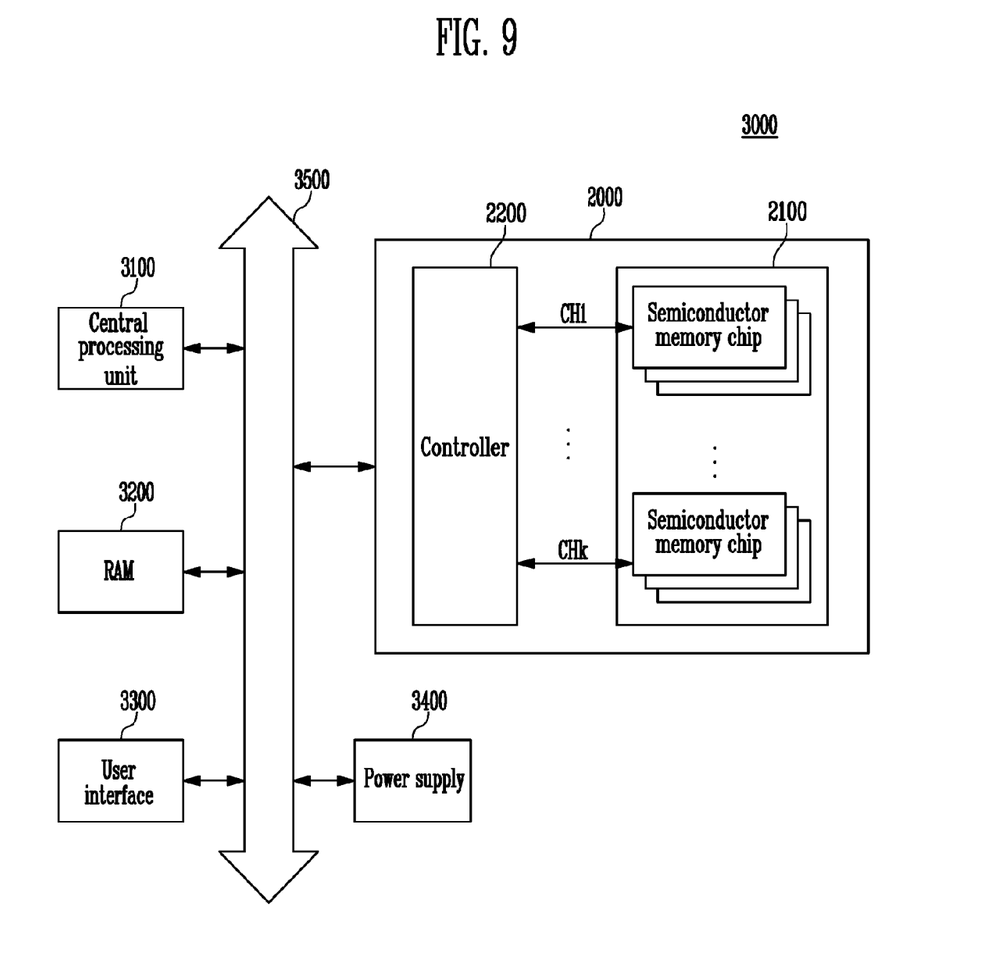
FIG. 9 is a block diagram showing a computing system including the memory system illustrated with reference to FIG. 8.

FIG. 9 is a block diagram showing a computing system 3000 including the memory system illustrated with reference to FIG. 8.

Referring to FIG. 9, the computing system 3000 includes a central processing unit 3100, a random access memory (RAM) 3200, a user interface 3300, a power supply 3400, a system bus 3500, and a memory system 2000.

In addition, the memory system 2000 is electrically coupled to the central processing unit 3100, the RAM 3200, the user interface 3300 and the power supply 3400 via the system bus 3500. Data provided through the user interface 3300 or processed by the central processing unit 3100 is stored in the memory system 2000.

In FIG. 9, the semiconductor memory device 2100 is shown as being coupled to the system bus 3500 through the controller 2200. However, the semiconductor memory device 2100 may be configured to be directly coupled to the system bus 3500. In this case, the function of the controller 2200 may be performed by the central processing unit 3100 and the RAM 3200.

The memory system illustrated with reference to FIG. 8 is shown in FIG. 9. However, the memory system 2000 may be replaced with the memory system 1000 described with reference to FIG. 7. As an example, the computing system 3000 may be configured to include both of the memory systems 1000 and 2000 described with reference to FIGS. 7 and 8.

According to an embodiment of the present invention, there is provided the voltage regulator that can stabilize an output voltage quickly when the output voltage fluctuates due to a change in a load current.

According to an embodiment of the present invention, there is provided the apparatus for controlling a bias current, which can be coupled to a voltage regulator to stabilize an output voltage of the voltage regulator quickly when the output voltage fluctuates.

While the invention has been described with reference to various embodiments, it will be apparent to those skilled in the art that various changes and modifications may be made without departing from the spirit and scope of the invention. Thus, the scope of the invention shall not be restricted or limited by the foregoing detailed description, but is to be determined by the following claims and their equivalents.

What is claimed is:

1. A voltage regulator comprising:
   a comparator configured to compare a feedback voltage with a reference voltage to output an enable signal and operate based on a bias current;
   a pass transistor turned on according to the enable signal and configured to output an external power voltage as an output voltage;
   a voltage distribution circuit configured to distribute and output the output voltage to an input terminal of the comparator; and
   a bias current control unit configured to control an amount of the bias current supplied to the comparator based on the output voltage,
   wherein the bias current control unit comprises:
      a voltage sensing unit configured to sense a change of the output voltage and generate a current control signal; and
      a current control unit configured to control the amount of the bias current supplied to the comparator based on the current control signal, and
   wherein the voltage sensing unit comprises:
      an internal current source;
      a first PMOS transistor having a drain coupled to the internal current source, a source coupled to the external power voltage, and a gate coupled to the drain;
      a resistor having one end coupled to the gate of the first PMOS transistor;
      a capacitor coupled between the other end of the resistor and the output terminal; and
      a second PMOS transistor having a gate coupled to the other end of the resistor and a source coupled to the external power voltage.

2. The voltage regulator of claim 1, wherein, when the output voltage drops, the bias current control unit is configured to increase the amount of the bias current supplied to the comparator.

3. The voltage regulator of claim 1, wherein the current control unit comprises a mirror circuit coupled to a drain of the second PMOS transistor of the voltage sensing unit.

4. The voltage regulator of claim 3, wherein the mirror circuit comprises:
   a first NMOS transistor having a drain electrically coupled to the drain of the second PMOS transistor of the voltage sensing unit, a source electrically coupled to the ground, and a gate coupled to the drain; and
   a second NMOS transistor having a gate electrically coupled to the gate of the second PMOS transistor, a source electrically coupled to the ground, and a drain coupled to the comparator.

5. A bias current control device comprising:
   a voltage sensing block electrically coupled to an output terminal of a voltage regulator and configured to generate a current control signal in response to a voltage change of the output terminal; and
   a current control unit electrically coupled to a bias current input terminal of the voltage regulator and configured to control a current flowing into the bias current input terminal in response to the current control signal sensing block,
   wherein the voltage sensing block comprises:
      an internal current source;
      a first PMOS transistor having a drain electrically coupled to the internal current source, a source electrically coupled to the external power voltage, and a gate electrically coupled to the drain;
      a resistor having one end coupled to the gate of the first PMOS transistor; and
      a capacitor connected between the other end of the resistor and the output terminal; and
      a second PMOS transistor having a gate electrically coupled to the other end of the resistor and a source electrically coupled to the external power voltage.

6. The bias current control device of claim 5, wherein the second PMOS transistor is turned on based on a drop of the output voltage to increase a drain current.

7. The bias current control device of claim 6, wherein the current control unit comprises a mirror circuit coupled to a drain of a second PMOS transistor of the voltage sensing block, and
   the mirror circuit increases the bias current of the voltage regulator based on an increase in the drain current of the second PMOS transistor.

8. The bias current control device of claim 6, wherein a drain current of the second PMOS transistor is applied as a current control signal.

9. The bias current control device of claim 5, wherein the voltage sensing block is configured to control an output current in response to a change in the output voltage.

10. The bias current control device of claim 5, wherein current flowing into the bias current input terminal increases in response to a drop of the output voltage.

11. The bias current control device of claim 5, wherein an output voltage of the voltage regulator is recovered to a normal state.

12. A memory system comprising:
a controller coupled to a semiconductor memory device, wherein the semiconductor memory device comprises:
  a comparator configured to compare a feedback voltage with a reference voltage to output an enable signal and operate based on a bias current;
  a pass transistor turned on according to the enable signal and configured to output an external power voltage as an output voltage;
  a voltage distribution circuit configured to distribute and output the output voltage to an input terminal of the comparator; and
  a bias current control unit configured to control an amount of the bias current supplied to the comparator based on the output voltage,
  wherein the bias current control unit comprises:
    a voltage sensing unit configured to sense a change of the output voltage and generate a current control signal; and
    a current control unit configured to control the amount of the bias current supplied to the comparator based on the current control signal, and wherein the voltage sensing unit comprises:
  an internal current source;
  a first PMOS transistor having a drain coupled to the internal current source, a source coupled to the external power voltage, and a gate coupled to the drain;
  a resistor having one end coupled to the gate of the first PMOS transistor;
  a capacitor coupled between the other end of the resistor and the output terminal; and
  a second PMOS transistor having a gate coupled to the other end of the resistor and a source coupled to the external power voltage.

* * * * *